United States Patent
Igarashi

(10) Patent No.: US 11,970,778 B2
(45) Date of Patent: Apr. 30, 2024

(54) PROCESSING APPARATUS

(71) Applicant: Tokyo Electron Limited, Tokyo (JP)

(72) Inventor: Reita Igarashi, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 207 days.

(21) Appl. No.: 17/650,090

(22) Filed: Feb. 7, 2022

(65) Prior Publication Data

US 2022/0259736 A1 Aug. 18, 2022

(30) Foreign Application Priority Data

Feb. 15, 2021 (JP) ................................. 2021-021731

(51) Int. Cl.
*C23C 16/40* (2006.01)
*C23C 16/44* (2006.01)
*C23C 16/455* (2006.01)

(52) U.S. Cl.
CPC .... *C23C 16/45563* (2013.01); *C23C 16/4412* (2013.01)

(58) Field of Classification Search
CPC .......... C23C 16/45563; C23C 16/4412; C23C 16/4409; C23C 16/45504; C23C 16/45546; C23C 16/52; C23C 16/54; C23C 16/45551; C23C 16/545; C23C 14/568; C23C 16/4401; H01J 37/3244; H01J 37/32449; H01J 37/32779; H01J 37/32834; H01L 21/67103; H01L 21/67017; H01L 21/6719; H01L 21/67196; H01L 21/67201; H01L 21/67173; H01L 21/67184; H01L 21/6776; H01L 21/67161; H01L 21/67155; H01L 21/67069; H01L 21/67748; H01L 21/67751; H01L 21/67745
USPC ........................ 118/719; 156/345.31, 345.32
See application file for complete search history.

(56) References Cited

U.S. PATENT DOCUMENTS

| | | | | |
|---|---|---|---|---|
| 10,907,253 | B2* | 2/2021 | Hiramatsu | ........ C23C 16/45546 |
| 2012/0199067 | A1* | 8/2012 | Morozumi | .......... C23C 16/4412 |
| | | | | 118/719 |
| 2017/0294318 | A1* | 10/2017 | Yoshida | ............ C23C 16/45563 |
| 2018/0371614 | A1* | 12/2018 | Yoshida | ............ H01L 21/02123 |
| 2019/0071777 | A1* | 3/2019 | Yoshida | ............ C23C 16/45546 |

(Continued)

FOREIGN PATENT DOCUMENTS

JP 2016-178136 A 10/2016

*Primary Examiner* — Rudy Zervigon
(74) *Attorney, Agent, or Firm* — Armstrong Teasdale LLP

(57) ABSTRACT

A processing apparatus includes: a processing container having a substantially cylindrical shape; a gas supply pipe configured to supply a gas into the processing container; and an exhaust duct extending in a longitudinal direction of the processing container to form an exhaust window configured to exhaust the gas from an interior of the processing container, a first exhaust flow path configured to exhaust, from a first side in a longitudinal direction of the exhaust window, the gas exhausted through the exhaust window, and a second exhaust flow path configured to exhaust, from a second side in the longitudinal direction of the exhaust window, the gas exhausted through the exhaust window, wherein the exhaust duct includes: a first gas introduction part configured to introduce a ballast gas into the first exhaust flow path, and a second gas introduction part configured to introduce the ballast gas into the second exhaust flow path.

17 Claims, 16 Drawing Sheets

(56) References Cited

U.S. PATENT DOCUMENTS

| | | | | |
|---|---|---|---|---|
| 2019/0106787 A1* | 4/2019 | Ohno | ................ | C23C 16/45563 |
| 2020/0407851 A1* | 12/2020 | Hiramatsu | ........ | C23C 16/45578 |
| 2021/0013032 A1* | 1/2021 | Hanashima | ....... | H01L 21/02238 |

* cited by examiner

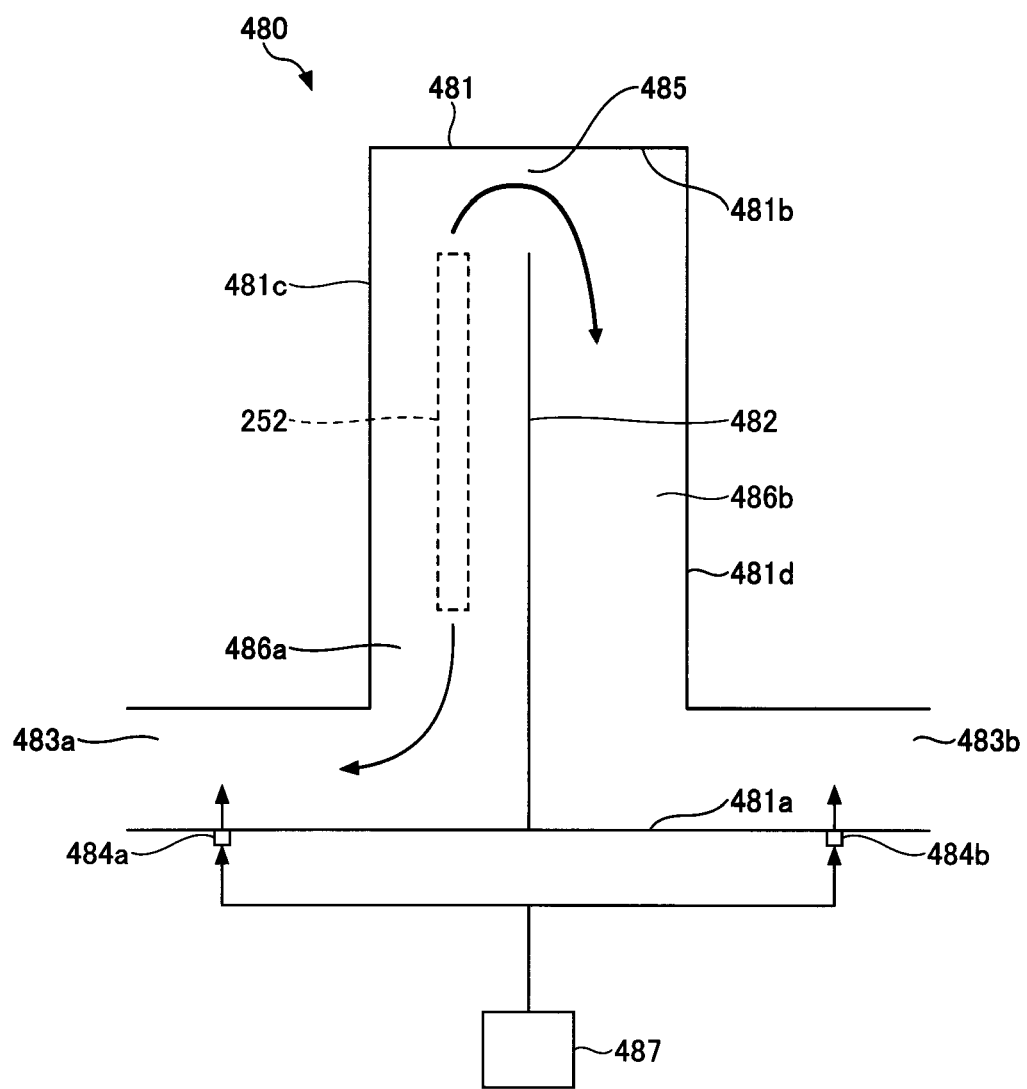

PROCESSING APPARATUS

CROSS-REFERENCE TO RELATED APPLICATION

This application is based upon and claims the benefit of priority from Japanese Patent Application No. 2021-021731, filed on Feb. 15, 2021, the entire contents of which are incorporated herein by reference.

TECHNICAL FIELD

The present disclosure relates to a processing apparatus.

BACKGROUND

There is known a processing apparatus that includes a processing container accommodating a boat on which substrates are placed, and an injector extending vertically along the inner wall of the processing container in the vicinity of the processing container and having a plurality of gas holes in the longitudinal direction thereof (see, for example, Patent Document 1). Patent Document 1 discloses a technique that suppresses bias of a gas flow inside the processing container, which includes an inner cylinder and an outer cylinder, by providing a straightening vane between the outer peripheral wall of the inner cylinder and the inner peripheral wall of the outer cylinder.

PRIOR ART DOCUMENT

[Patent Document]
Patent Document 1: Japanese Laid-Open Patent Publication No. 2016-178136

SUMMARY

A processing apparatus according to an embodiment of the present disclosure includes: a processing container having a substantially cylindrical shape; a gas supply pipe configured to supply a gas into the processing container; and an exhaust duct extending in a longitudinal direction of the processing container to form an exhaust window configured to exhaust the gas from an interior of the processing container, a first exhaust flow path configured to exhaust, from a first side in a longitudinal direction of the exhaust window, the gas exhausted through the exhaust window, and a second exhaust flow path configured to exhaust, from a second side in the longitudinal direction of the exhaust window, the gas exhausted through the exhaust window, wherein the exhaust duct includes: a first gas introduction part configured to introduce a ballast gas into the first exhaust flow path, and a second gas introduction part configured to introduce the ballast gas into the second exhaust flow path.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

FIG. 12 is a view illustrating an example of an exhaust duct of the processing apparatus of the fourth embodiment.

DETAILED DESCRIPTION

Figure 1:
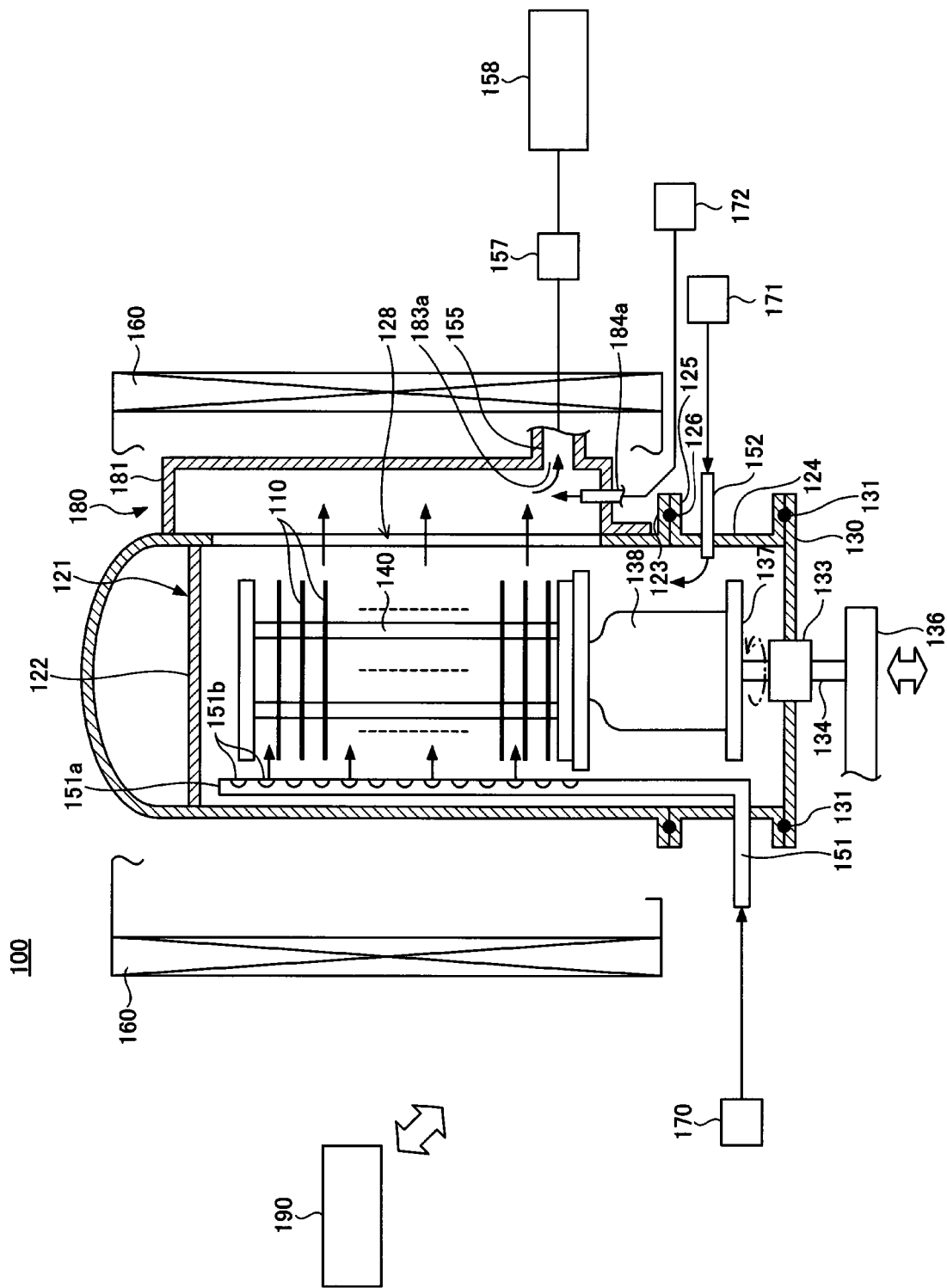
FIG. 1 is a vertical cross-sectional view illustrating an example of a processing apparatus of a first embodiment.
Figure 2:
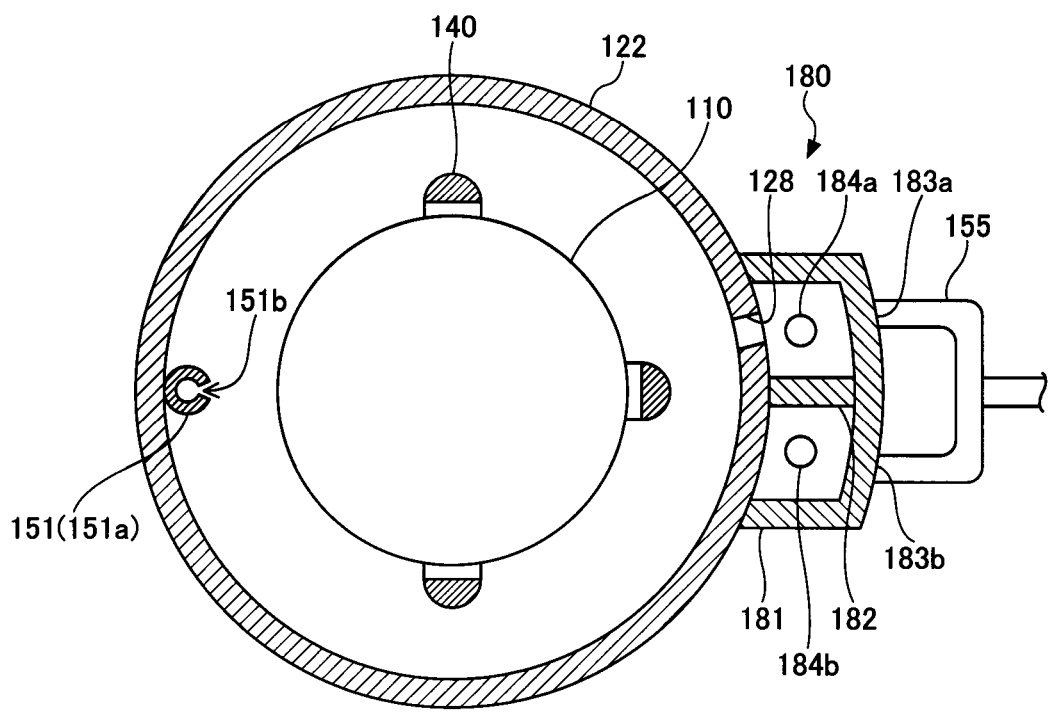
FIG. 2 is a horizontal cross-sectional view illustrating an example of the processing apparatus of the first embodiment.
Figure 3:
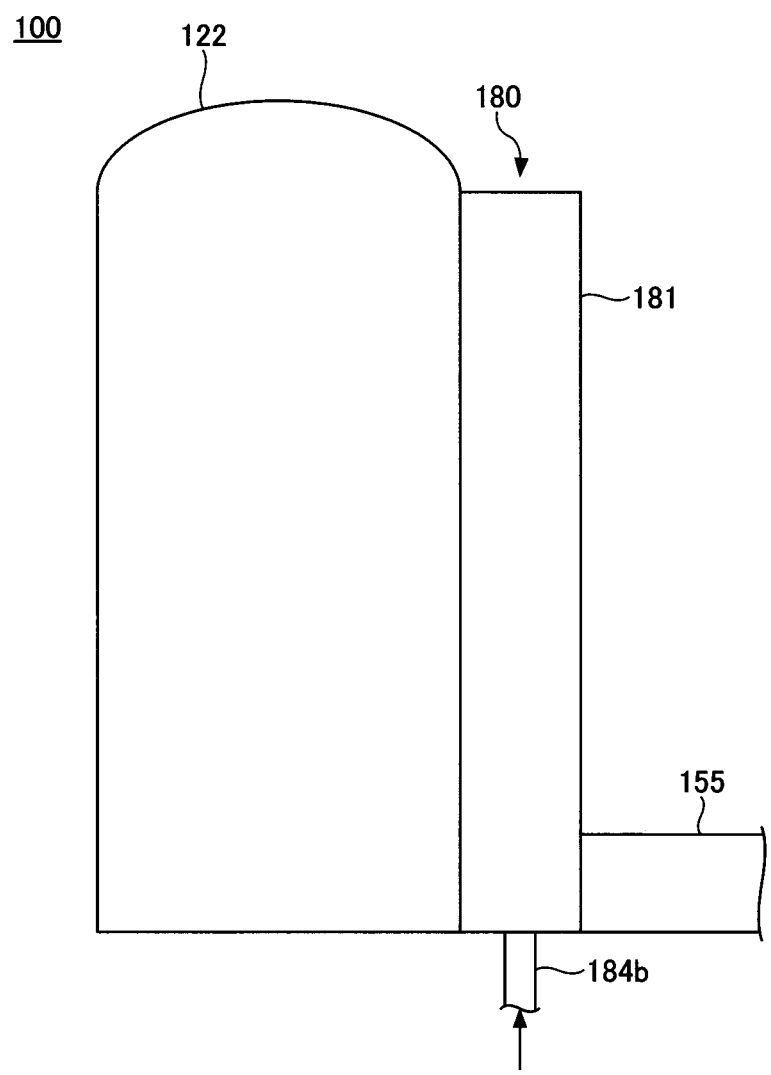
FIG. 3 is a side view illustrating an example of the processing apparatus of the first embodiment.
Figure 4:
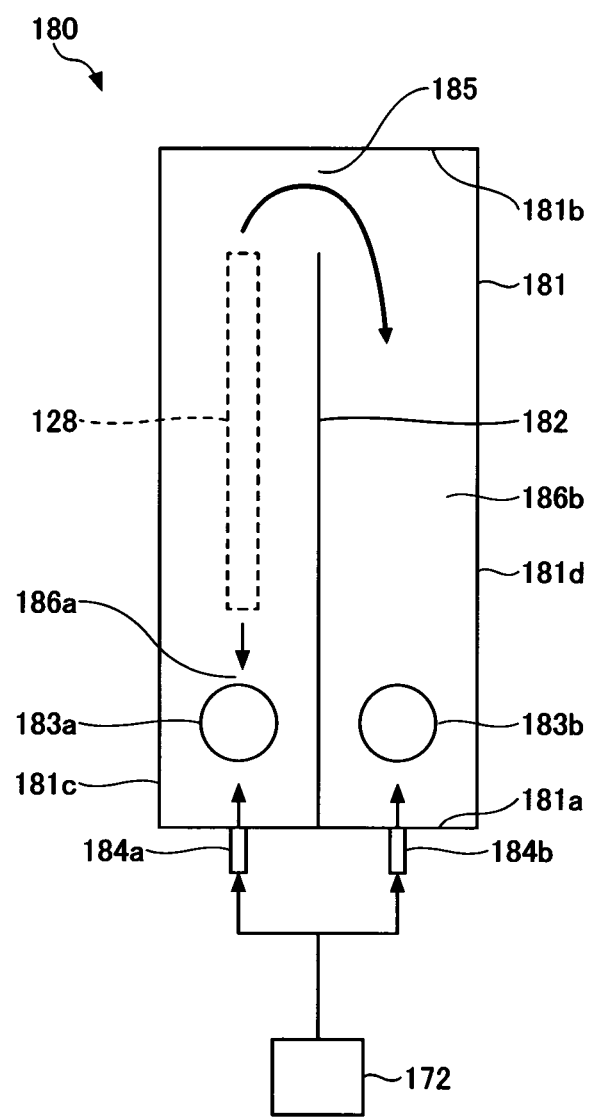
FIG. 4 is a view illustrating an example of an exhaust duct of the processing apparatus of the first embodiment.

Hereinafter, non-limiting exemplary embodiments of the present disclosure will be described with reference to the accompanying drawings. In all of the accompanying drawings, the same or corresponding members or components will be denoted by the same or corresponding reference numerals, and redundant descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

An example of a processing apparatus of a first embodiment will be described with reference to FIGS. 1 to 4. The processing apparatus of the first embodiment is a batch-type vertical processing apparatus that is capable of forming a film on a plurality of substrates simultaneously and collectively. The processing apparatus of this embodiment is an apparatus for depositing a film on the substrates through, for example, chemical vapor deposition (CVD) or atomic layer deposition (ALD).

The processing apparatus 100 of the first embodiment includes a processing container 121 including therein a space in which substrates 110 are processed, a lid 130 configured to hermetically close an opening in the lower end of the processing container 121, and a substrate holder 140 configured to hold the substrates 110. The substrates 110 are, for example, semiconductor wafers such as silicon wafers. The substrate holder 140 is also called a wafer boat.

The processing container 121 includes a substantially cylindrical processing container body 122 having a ceiling portion with an open lower end. The processing container body 122 is made of, for example, quartz. A flange portion 123 is formed at the lower end of the processing container body 122. The processing container 121 includes, for example, a manifold 124 having a substantially cylindrical shape. The manifold 124 is made of, for example, stainless steel. A flange portion 125 is formed at the upper end of the manifold 124. The flange portion 123 of the processing container body 122 is installed on the flange portion 125. A sealing member 126 such as an O-ring is sandwiched between the flange portion 125 and the flange portion 123.

The lid 130 is hermetically attached to the opening at the lower end of the manifold 124 via a sealing member 131 such as an O-ring. The lid 130 is made of, for example, stainless steel. A through-hole that penetrates the lid 130 in the vertical direction is formed in the central portion of the lid 130. A rotary shaft 134 is arranged in the through-hole. A gap between the lid 130 and the rotary shaft 134 is sealed by a magnetic fluid sealing portion 133. The lower end of the rotary shaft 134 is rotatably supported by an arm 136 of a lifting part (not illustrated). A rotary plate 137 is provided at the upper end of the rotary shaft 134. A substrate holder 140 is installed on the rotary plate 137 via a heat retaining stage 138.

The substrate holder 140 holds a plurality of substrates 110 at intervals in the vertical direction. Each of the plurality of substrates 110 is held horizontally. The substrate holder 140 is made of, for example, quartz ($SiO_2$) or silicon carbide (SiC). When the arm 136 is raised by the lifting part (not illustrated), the lid 130 and the substrate holder 140 are raised, the substrate holder 140 is carried into the processing container 121, and the opening at the lower end of the processing container 121 is hermetically closed by the lid 130. In addition, when the arm 136 is lowered by the lifting part (not illustrated), the lid 130 and the substrate holder 140 are lowered, and the substrate holder 140 is carried out of the processing container 121. Further, when the rotary shaft 134 is rotated, the substrate holder 140 is rotated together with the rotary plate 137.

The processing apparatus 100 in the present embodiment includes gas supply pipes 151 and 152. The gas supply pipe 151 is made of, for example, quartz ($SiO_2$), and supplies a gas to the interior of the processing container 121. The processing apparatus 100 may include yet another gas supply pipe.

The gas supply pipe 151 includes, for example, a nozzle part 151a vertically arranged inside the processing container body 122. The nozzle part 151a is provided with a plurality of gas holes 151b at intervals in the vertical direction. The plurality of gas holes 151b eject the gas horizontally. The nozzle part 151a has a horizontal portion of a gas supply pipe that horizontally penetrates the manifold 124, and each gas supplied to the horizontal portion is sent to the nozzle part 151a and ejected horizontally from each gas hole 151b. The gas supply pipe 152 horizontally penetrates the manifold 124, and the gas supplied to the gas supply pipe 152 from the exterior of the manifold 124 is ejected to the interior of the manifold 124.

The processing container body 122 is provided with an exhaust window 128. The exhaust window 128 is provided at a position facing the gas holes 151b. The exhaust window 128 evacuates the interior of the processing container 121. The exhaust window 128 is a rectangular exhaust slit, the longitudinal direction of which is the vertical direction. However, the exhaust window 128 may be a plurality of exhaust holes provided at intervals in the vertical direction. The exhaust holes may have, for example, a circular or rectangular shape. In addition, the exhaust window 128 may be a combination of an exhaust slit and exhaust holes. The processing container body 122 is provided with an exhaust duct 180 to surround the exhaust window 128.

The exhaust duct 180 includes a wall portion 181, a flow-dividing plate 182, exhaust ports 183a and 183b, and gas introduction ports 184a and 184b.

The wall portion 181 is installed on the outer wall of the processing container body 122 to surround the exhaust window 128. The wall portion 181 is formed to protrude radially outward from the processing container body 122.

The flow-dividing plate 182 is provided inside the wall portion 181. The flow-dividing plate 182 has a rectangular shape and is provided parallel to the longitudinal direction of the exhaust window 128. The flow-dividing plate 182 connects the outer wall of the processing container body 122 and the inner wall of the wall portion 181. The flow-dividing plate 182 extends upward from the bottom portion 181a of the wall portion 181 and forms a gap 185 with a ceiling portion 181b of the wall portion 181. As a result, a portion of a processing gas flowing from the exhaust window 128 into the wall portion 181 passes through an exhaust flow path 186a, which leads to the exhaust port 183a from below the exhaust window 128, and the rest of the processing gas passes through the gap 185, which leads to the exhaust port 186a from above the exhaust window 128, and is exhausted through an exhaust flow path 186b, which leads to the exhaust port 183b.

The exhaust port 183a is provided below the exhaust window 128 in the wall portion 181. The exhaust port 183a exhausts, from below the exhaust window 128, the processing gas that flows from the exhaust window 128 into the wall portion 181.

The exhaust port 183b is provided at a position of the wall portion 181 at which the flow-dividing plate 182 is sandwiched. The exhaust port 183b exhausts, from above the exhaust window 128, the processing gas that flows from the exhaust window 128 into the wall portion 181.

The gas introduction port 184a is provided in the bottom portion 181a of the wall portion 181 on the side where the exhaust window 128 is provided. However, the gas introduction port 184a may be provided below the exhaust window 128 in a side portion 181c of the wall portion 181 on the side where the exhaust window 128 is provided. The gas introduction port 184a introduces a ballast gas into the exhaust flow path 186a.

The gas introduction port 184b is provided in the bottom portion 181a of the wall portion 181 on the side where the exhaust window 128 is not provided. However, the gas introduction port 184b may be provided in a side portion 181d of the wall portion 181 on the side where the exhaust window 128 is not provided. In addition, the gas introduction port 184b may be provided above the exhaust window 128 in the side portion 181c of the wall portion 181 on the side where the exhaust window 128 is provided. Furthermore, the gas introduction port 184*b* may be provided in the ceiling portion 181*b* of the wall portion 181. The gas introduction port 184*b* introduces the ballast gas into the exhaust flow path 186*b*.

The gas introduction ports 184*a* and 184*b* may be openings formed in the wall portion 181 or may be gas pipes that penetrate the wall portion 181 and extend to the interior of the wall portion 181. The ballast gas is, for example, an inert gas such as $N_2$ or Ar.

In the exhaust duct 180, the processing gas supplied into the processing container 121 passes through the exhaust window 128 and flows into the wall portion 181. The processing gas that has flowed into the wall portion 181 is exhausted through either the exhaust port 183*a* or the exhaust port 183*b*. At this time, by introducing the ballast gas into the wall portion 181 from the gas introduction ports 184*a* and 184*b*, it is possible to control the conductance of the exhaust flow path 186*a* and the conductance of the exhaust flow path 186*b*. This makes it possible to adjust the balance between a flow rate of the processing gas exhausted through the exhaust port 183*a* and a flow rate of the processing gas exhausted through the exhaust port 183*b*. That is, it is possible to adjust an upward exhaust strength and a downward exhaust strength of the processing gas flowing through the exhaust window 128 in the exhaust duct 180. As a result, it is possible to adjust a flow rate distribution of the processing gas in the vertical direction (the interplane direction) inside the processing container 121.

For example, by increasing the flow rate of the ballast gas introduced from the gas introduction port 184*a* to the exhaust flow path 186*a*, the flow rate of the processing gas exhausted through the exhaust port 183*a* is decreased, and the flow rate of the processing gas exhausted through the exhaust port 183*b* is increased. In addition, by decreasing the flow rate of the ballast gas introduced from the gas introduction port 184*a* to the exhaust flow path 186*a*, the flow rate of the processing gas exhausted through the exhaust port 183*a* is increased, and the flow rate of the processing gas exhausted through the exhaust port 183*b* is decreased.

For example, by increasing the flow rate of the ballast gas introduced from the gas introduction port 184*b* to the exhaust flow path 186*b*, the flow rate of the processing gas exhausted through the exhaust port 183*a* is increased, and the flow rate of the processing gas exhausted through the exhaust port 183*b* is decreased. In addition, by decreasing the flow rate of the ballast gas introduced from the gas introduction port 184*b* to the exhaust flow path 186*b*, the flow rate of the processing gas exhausted through the exhaust port 183*a* is decreased, and the flow rate of the processing gas exhausted from the exhaust port 183*b* is increased.

An exhaust pipe 155 is connected to the exhaust ports 183*a* and 183*b*. An opening/closing valve 157 and an exhaust device 158 are connected to the exhaust pipe 155 in this order. By opening/closing the opening/closing valve 157, the exhaust inside the processing container 121 is controlled. The opening/closing valve 157 also serves as a pressure control valve for controlling an internal gas pressure of the processing container 121. The exhaust device 158 includes a vacuum pump to exhaust the gas inside the processing container 121. The exhausted gas is sent to a detoxifying apparatus (not illustrated), and after removing harmful components of the exhaust gas, the exhaust gas is released into the air.

The processing apparatus 100 in the present embodiment includes a heater 160. By heating the interior of the processing container 121, the heater 160 improves the processing capacity of the gas supplied into the processing container 121. The heater 160 is arranged outside the processing container 121, and heats the interior of the processing container 121 from the exterior of the processing container 121. For example, the heater 160 is formed in a substantially cylindrical shape so as to surround the processing container body 122. The heater 160 is configured with, for example, an electric heater or the like.

The processing apparatus 100 in the present embodiment includes a processing gas supplier 170. The processing gas supplier 170 supplies the processing gas into the processing container 121. The processing gas includes, for example, a raw-material gas used for film formation. The processing gas supplier 170 includes a processing gas source, a processing gas pipe, a flow rate controller, a valve (none of which is illustrated), and the like. Since the processing gas source and the gas supply pipe 151 are connected to each other by the processing gas pipe, the processing gas is supplied from the processing gas source to the gas supply pipe 151. The processing gas is horizontally ejected from the gas holes 151*b* in the nozzle part 151*a* toward the substrates 110. Since the flow rate controller and the valve are provided in the processing gas pipe, the flow rate of the processing gas is controlled by the flow rate controller, and the supply of the processing gas is controlled by opening/closing the valve.

The processing apparatus 100 in the present embodiment includes a purge gas supplier 171. The purge gas supplier 171 removes the processing gas remaining inside the processing container 121 by supplying a purge gas into the processing container 121. The purge gas may be, for example, an inert gas such as $N_2$ or Ar. The purge gas supplier 171 includes a purge gas source, a purge gas pipe, a flow rate controller, a valve (none of which is illustrated), and the like. Since the purge gas source and the gas supply pipe 152 are connected to each other by the purge gas pipe, the purge gas is supplied from the purge gas source to the gas supply pipe 152. The purge gas supplied to the gas supply pipe 152 is ejected to the interior of the manifold 124. Since the flow rate controller and the valve are provided in the purge gas pipe, a flow rate of the purge gas is controlled by the flow rate controller, and the supply of the purge gas is controlled by opening/closing the valve. In the present embodiment, the case in which the purge gas is supplied from the gas supply pipe 152 has been described, but the present disclosure is not limited thereto. For example, the purge gas may be supplied from the gas supply pipe 151.

The processing apparatus 100 in the present embodiment includes a ballast gas supplier 172. The ballast gas supplier 172 controls the flow of the processing gas in the exhaust duct 180 by supplying the ballast gas into the exhaust duct 180. The ballast gas may be, for example, an inert gas such as $N_2$ or Ar. The ballast gas supplier 172 includes a ballast gas source, a ballast gas pipe, a flow rate controller, a valve (none of which is illustrated), and the like. Since the ballast gas source and the gas introduction ports 184*a* and 184*b* are connected to each other by the ballast gas pipe, the ballast gas is supplied from the ballast gas source to the gas introduction ports 184*a* and 184*b*. The ballast gas supplied to the gas introduction ports 184*a* and 184*b* is ejected into the exhaust duct 180. Since the flow rate controller and the valve are provided in the ballast gas pipe, a flow rate of the ballast gas is controlled by the flow rate controller, and the supply of the ballast gas is controlled by opening/closing the valve. The purge gas pipe of the purge gas supplier 171 may be branched and connected to the gas introduction ports 184*a* and 184*b*, and the purge gas from the purge gas source may be used as the ballast gas.

The processing apparatus 100 in the present embodiment includes a controller 190. The controller 190 is, for example, a computer, and controls the overall operation of the processing apparatus 100. A computer program that performs the overall operation of the processing apparatus 100 may be stored in a storage medium. The storage medium may be, for example, a flexible disk, a compact disk, a hard disk, a flash memory, a DVD, or the like.

Second Embodiment

Figure 5:
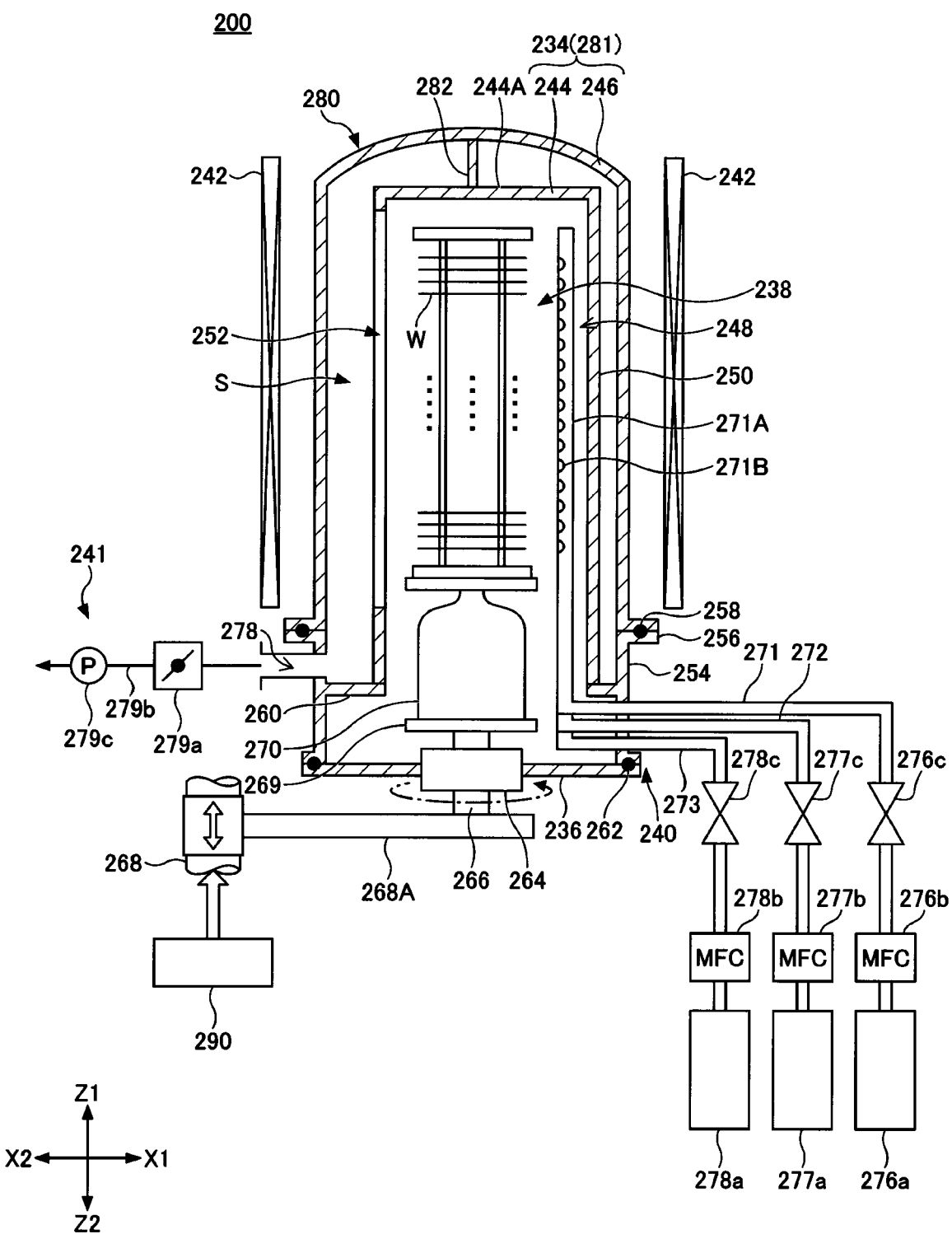
FIG. 5 is a vertical cross-sectional view illustrating an example of a processing apparatus of a second embodiment.

An example of a processing apparatus of a second embodiment will be described with reference to FIGS. 5 to 7. The processing apparatus of the second embodiment is a batch-type vertical processing apparatus capable of forming a film on a plurality of substrates simultaneously and collectively. The processing apparatus of the embodiment is an apparatus for depositing a film on the substrates through, for example, CVD or ALD.

The processing apparatus 200 includes a processing container 234 in which the substrates W are accommodated and a lid 236 configured to close an opening at the lower end of the processing container 234 on a Z2 side. The substrates W may be, for example, semiconductor wafers such as silicon wafers. In addition, the processing apparatus 200 includes a substrate holder 238 capable of being accommodated in the processing container 234 and configured to hold the plurality of substrates W at predetermined intervals, a gas supplier 240 configured to supply gas into the processing container 234, and an exhauster 241 configured to exhaust the gas within the processing container 234. A heater 242 configured to heat the interior of the processing container 234 is provided outside the processing container 234.

The processing container 234 includes a substantially cylindrical inner tube 244 having a lower open end on the Z2 side and a ceiling portion 244A on a Z1 side, and a substantially cylindrical outer tube 246 having a lower open end on the Z2 side and a ceiling on the Z1 side and configured to cover the exterior of the inner tube 244. The inner tube 244 and the outer tube 246 are formed of a heat-resistant material such as quartz, and are coaxially arranged in the Z1-Z2 direction to form a double-tube structure.

The ceiling portion 244A of the inner tube 244 is, for example, flat. Inside the inner tube 244, a nozzle accommodation portion 248 for accommodating therein a gas supply pipe is formed in the Z1-Z2 direction. For example, as illustrated in FIG. 6, a convex portion 250 protruding outward in the X1 direction is formed in a portion of the side wall of the inner tube 244, and the interior of the formed convex portion 250 may be used as the nozzle accommodation portion 248. In the side wall on the X2 side opposite to the inner tube 244 facing the nozzle accommodation portion 248, a rectangular exhaust window 252 having a width L1 is formed in the Z1-Z2 direction.

The exhaust window 252 is an exhaust port for evacuating the interior of the inner tube 244. The length of the exhaust window 252 in the Z1-Z2 direction is the same as the length of the substrate holder 238, or is formed longer than the length of the substrate holder 238. That is, the upper end of the exhaust window 252 on the Z1 side is formed to be longer on the Z1 side than a position corresponding to the upper end of the substrate holder 238, and the lower end of the exhaust window 252 on the Z2 side is formed to be longer on the Z2 side than a position corresponding to the lower end of the substrate holder 238.

The lower end of the processing container 234 on the Z2 side is supported by a substantially cylindrical manifold 254 formed of, for example, stainless steel. A flange portion 256 is formed at the upper end of the manifold 254 on the Z1 side, and the lower end of the outer tube 246 on the Z2 side is connected to the flange portion 256. A seal member 258 such as an O-ring is provided between the flange portion 256 and the outer tube 246, and the flange portion 256 and the outer tube 246 are connected to each other via the seal member 258. In the present embodiment, a region inside the processing container 34 surrounded by the inner tube 244, the manifold 254, and the lid 236 may be referred to as the interior of the processing container.

An annular support portion 260 is provided on the inner wall on the Z1 side, which is the upper portion of the manifold 254, and the lower end of the inner tube 244 on the Z2 side is installed on the support portion 260 so as to be supported thereon. The lid 236 is installed on the opening at the lower end of the manifold 254 on the Z2 side via a seal member 262 such as an O-ring, thereby hermetically blocking the opening of the processing container 234 at the lower end on the Z2 side, that is, the opening of the manifold 254. The lid 236 is formed of, for example, stainless steel.

Through the central portion of the lid 236, a rotary shaft 266 is provided via a magnetic fluid seal 264. A lower portion of the rotary shaft 266 on the Z2 side is rotatably supported on an arm 268A of a lifting part 268 configured as a boat elevator.

A rotary plate 269 is provided at the upper end of the rotary shaft 266 on the Z1 side, and the substrate holder 238 that holds the substrates W is placed on the rotary plate 269 via a heat retaining stage 270 made of quartz. Accordingly, by raising and lowering the arm 268A by the lifting part 268, the lid 236 and the substrate holder 238 move upward and downward integrally, so that the substrate holder 238 can be put in and out of the processing container 234.

Since the gas supplier 240 is provided in the manifold 254, it is possible to supply a first raw-material gas, a second raw-material gas, a purge gas, and the like into the inner tube 244. The gas supplier 240 includes a plurality of (e.g., three) gas supply pipes 271, 272, and 273 made of quartz. Inside the inner tube 244, the gas supply pipes 271, 272, and 273 include diffusion nozzle parts 271A, 272A, and 273A, respectively, along the Z1-Z2 direction. An end portion of each of the gas supply pipes 271, 272, and 273 on the Z2 direction side is bent toward the X1 side in an L shape and penetrates the manifold 254 to be supported.

Figure 6:
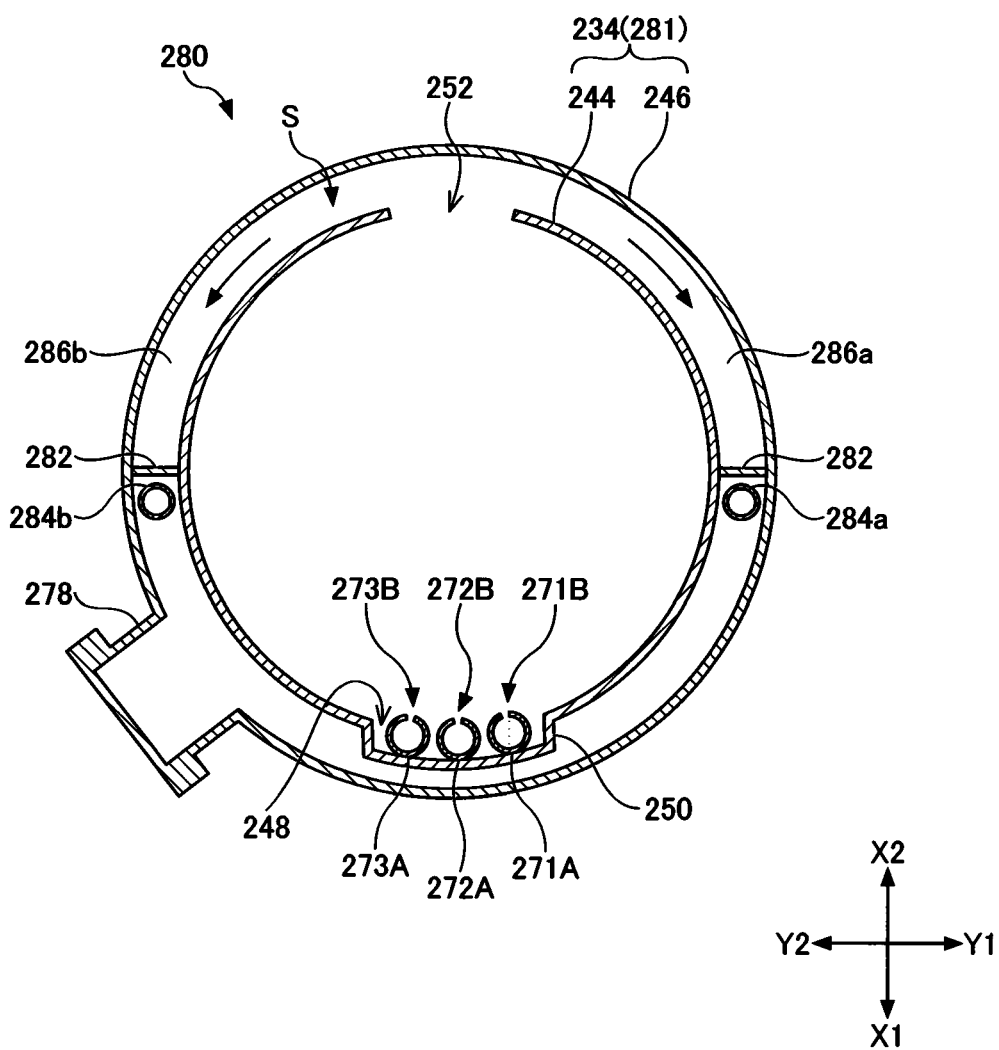
FIG. 6 is a horizontal cross-sectional view illustrating an example of the processing apparatus of the second embodiment.
Figure 7:
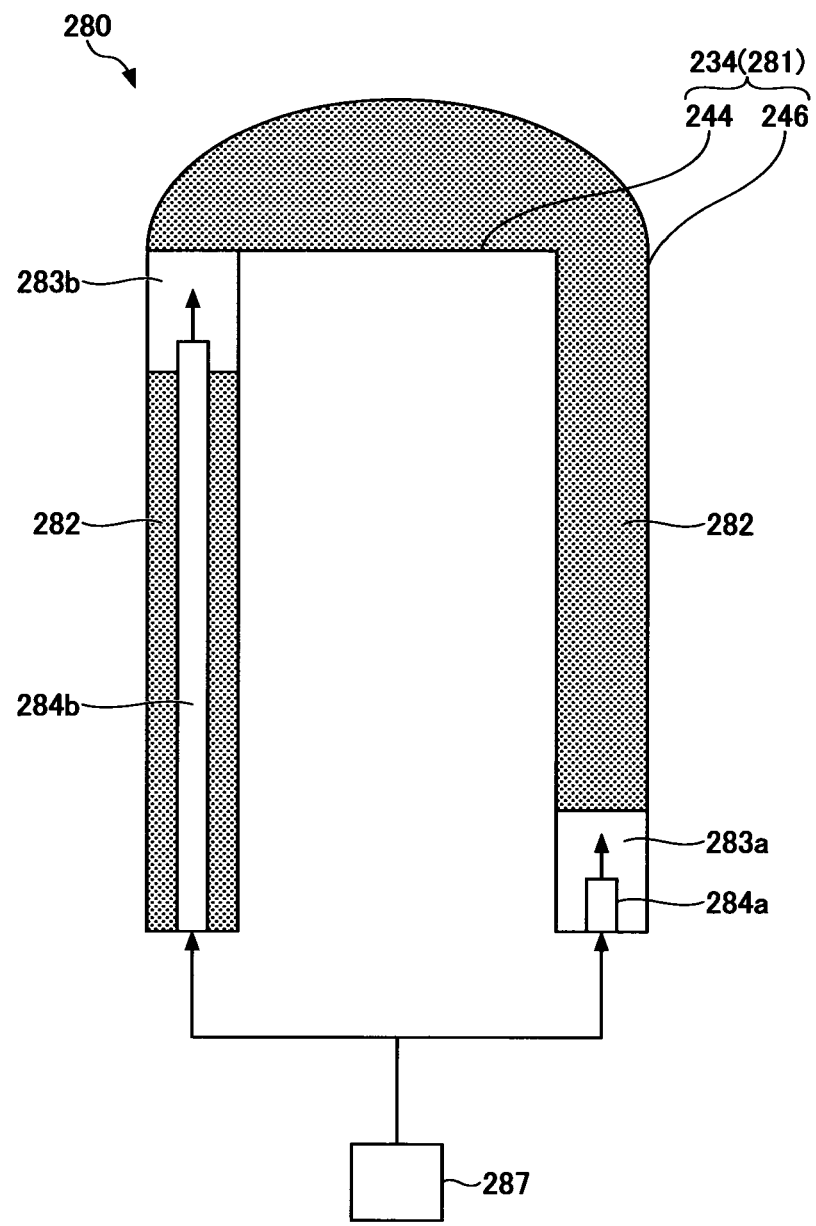
FIG. 7 is a vertical cross-sectional view illustrating an example of the processing apparatus of the second embodiment.

As illustrated in FIG. 6, the gas supply pipes 271, 272, and 273 are installed in the nozzle accommodation portion 248 of the inner tube 244 in the circumferential direction. In the gas supply pipes 271, 272, and 273, a plurality of gas holes 271B, 272B, and 273B are respectively formed in the diffusion nozzle part 271A, 272A, or 273A provided inside the inner tube 244 at predetermined intervals. Each gas hole 271B, 272B, or 273B ejects each gas in a substantially horizontal direction. The predetermined intervals are, for example, the same as the intervals of the substrates W supported by the substrate holder 238. Positions of the gas holes 271B, 272B, and 273B in the diffusion nozzle parts 271A, 272A, and 273A, respectively, in the Z1-Z2 direction are located in the middle between adjacent substrates W in the Z1-Z2 direction, so that it is possible to efficiently supply each gas to the spaces between the substrates W. However, the predetermined intervals between the respective gas holes 271B, 272B, and 273B are not limited to the above. A gas hole may be provided for each of the plurality of substrates W.

In addition, the position of each gas hole 271B, 272B, or 273B is not limited to the intermediate position between adjacent substrates W, and each gas hole may be provided at any position such as the same height as the substrate W. In addition, an orientation of each gas hole 271B, 272B, or 273B may be provided in any direction such as toward the center of the substrate W, toward the outer periphery of the substrate W, or toward the inner tube 244.

On the outer peripheral side of the outer tube 246, a substantially cylindrical heater 242 is provided to surround the perimeter of the outer tube 246. It is possible to heat the substrates W accommodated in the processing container 234 and the gases in the diffusion nozzle parts 271A and 272A of the gas supply pipes 271 and 272 using the heater 242.

In the present embodiment, a first raw-material gas is supplied from the gas supply pipe 271, a second raw-material gas is supplied from the gas supply pipe 272, and a purge gas is supplied from the gas supply pipe 273. A first raw-material gas source 276a is connected to the gas supply pipe 271 via a flow rate controller 276b and an opening/closing valve 276c. A second raw-material gas source 277a is connected to the gas supply pipe 272 via a flow rate controller 277b and an opening/closing valve 277c. A purge gas source 278a is connected to the gas supply pipe 273 via a flow rate controller 278b and an opening/closing valve 278c.

Since an exhaust pipe 278 is provided in the upper side wall of the manifold 254 on the Z1 side and above the support portion 260, the gas inside the inner tube 244 is exhausted from the exhaust window 252 through the space S between the inner tube 244 and the outer tube 246.

The processing gas flowing from the exhaust window 252 into the space S is exhausted while being divided into a downward direction and an upward direction by the exhaust duct 280.

The exhaust duct 280 includes a wall portion 281, a flow-dividing plate 282, exhaust ports 283a and 283b, and gas introduction ports 284a and 284b.

The wall portion 281 is configured with the inner tube 244 and the outer tube 246.

The flow-dividing plate 282 is provided inside the wall portion 281, in other words, in the space S between the inner tube 244 and the outer tube 246. The flow-dividing plate 282 has a plate shape and connects the outer wall of the inner tube 244 and the inner wall of the outer tube 246 to each other. The flow-dividing plate 282 limits one exhaust flow path 286a directed from the exhaust window 252 toward the exhaust pipe 278 to only the lower portion, and limits the other exhaust flow path 286b directed from the exhaust window 252 toward the exhaust pipe 278 to only the upper portion. As a result, a portion of a processing gas flowing from the exhaust window 252 into the space S passes through the exhaust flow path 286a, which leads to the exhaust pipe 278 from below the exhaust window 252, and the rest of the processing gas is exhausted through the exhaust flow path 286b, which leads to the exhaust pipe 278 from above the exhaust window 252.

The exhaust port 283a is formed below the space S by the flow-dividing plate 282. The exhaust port 283b is formed above the space S by the flow-dividing plate 282.

The gas introduction port 284a is a gas pipe that penetrates the manifold 254 and extends to the exhaust flow path 286a of the space S. The tip end of the gas pipe is located at substantially the same height as the exhaust port 283a. A ballast gas, the flow rate of which is controlled, is supplied from the ballast gas supplier 287 to the gas introduction port 284a. The gas introduction port 284a introduces the ballast gas supplied from the ballast gas supplier 287 into the exhaust flow path 286a.

The gas introduction port 284b is a gas pipe that penetrates the manifold 254 and extends to the exhaust flow path 286b of the space S. The tip end of the gas pipe is located at substantially the same height as the exhaust port 283b. A ballast gas, the flow rate of which is controlled, is supplied from the ballast gas supplier 287 to the gas introduction port 284b. The gas introduction port 284b introduces the ballast gas supplied from the ballast gas supplier 287 into the exhaust flow path 286b.

The ballast gas is, for example, an inert gas such as $N_2$ or Ar.

In the exhaust duct 280, the processing gas supplied into the inner tube 244 passes through the exhaust window 252 and flows into the space S. The processing gas that has flowed into the space S is exhausted through either the exhaust port 283a or the exhaust port 283b. At this time, by introducing the ballast gas into the interior of the wall portion 281 from the gas introduction ports 284a and 284b, it is possible to control the conductance of the exhaust flow path 286a and the conductance of the exhaust flow path 286b. This makes it possible to adjust the balance between a flow rate of the processing gas exhausted through the exhaust port 283a and a flow rate of the processing gas exhausted through the exhaust port 283b. That is, it is possible to adjust an upward exhaust strength and a downward exhaust strength of the processing gas flowing through the exhaust window 252 in the exhaust duct 280. As a result, it is possible to adjust a flow rate distribution of the processing gas in the vertical direction (the interplane direction) in the inner tube 244.

For example, by increasing the flow rate of the ballast gas introduced from the gas introduction port 284a to the exhaust flow path 286a, the flow rate of the processing gas exhausted through the exhaust port 283a is decreased, and the flow rate of the processing gas exhausted through the exhaust port 283b is increased. In addition, by decreasing the flow rate of the ballast gas introduced from the gas introduction port 284a to the exhaust flow path 286a, the flow rate of the processing gas exhausted through the exhaust port 283a is increased, and the flow rate of the processing gas exhausted through the exhaust port 283b is decreased.

Further, for example, by increasing the flow rate of the ballast gas introduced from the gas introduction port 284b to the exhaust flow path 286b, the flow rate of the processing gas exhausted through the exhaust port 283a is increased, and the flow rate of the processing gas exhausted through the exhaust port 283b is decreased. In addition, by decreasing the flow rate of the ballast gas introduced from the gas introduction port 284b to the exhaust flow path 286b, the flow rate of the processing gas exhausted through the exhaust port 283a is decreased, and the flow rate of the processing gas exhausted from the exhaust port 283b is increased.

The exhaust pipe 278 is connected to the exhauster 241. The exhauster 241 is provided with a pressure control valve 279a, an exhaust passage 279b, and a vacuum pump 279c in this order from the exhaust pipe 278, so that the interior of the processing container 234 can be evacuated.

In the present embodiment, the plurality of substrates W are installed inside the inner tube 244 in the Z1-Z2 direction, which is perpendicular to the wafer surfaces, such that wafer surfaces as substrate surfaces are parallel to the XY plane. The first raw-material gas and the second raw-material gas are released to the spaces between the substrates W from the gas holes 271B and 272B in the diffusion nozzle parts 271A and 272A. The released raw-material gas passes through the spaces between the substrates W and a film is formed, but the gas that does not contribute to the film formation goes out from the exhaust window 252 on the X2 side to the exterior of the inner tube 244, passes through the space S between the inner tube 244 and the outer tube 246, and is discharged from the exhaust pipe 278.

The processing apparatus 200 in the present embodiment includes a controller 290. The controller 290 is, for example, a computer, and controls the overall operation of the processing apparatus 200. A computer program that performs the overall operation of the processing apparatus 200 may be stored in a storage medium. The storage medium may be, for example, a flexible disk, a compact disk, a hard disk, a flash memory, a DVD, or the like.

Third Embodiment

Figure 8:
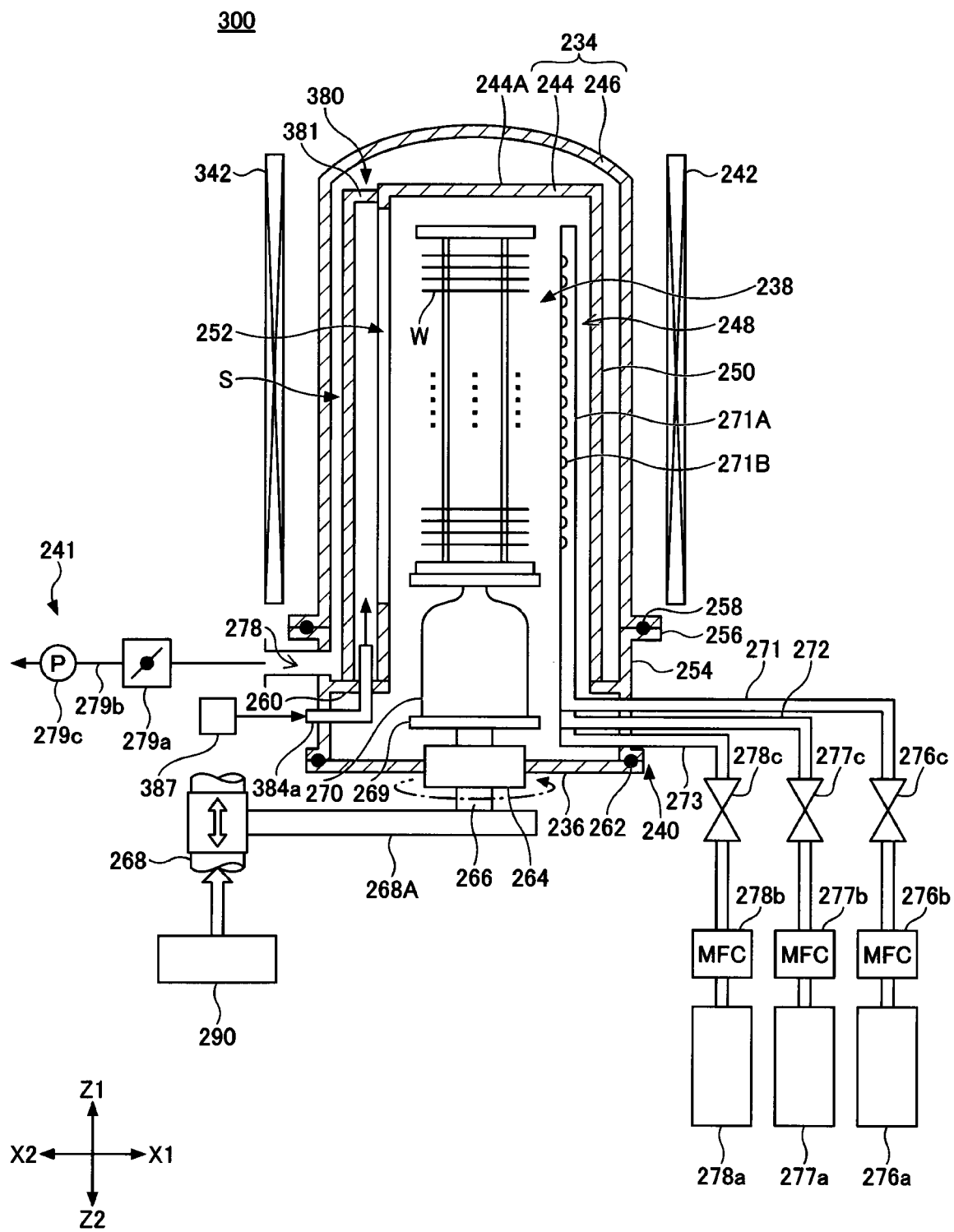
FIG. 8 is a vertical cross-sectional view illustrating an example of the processing apparatus of a third embodiment.
Figure 9:
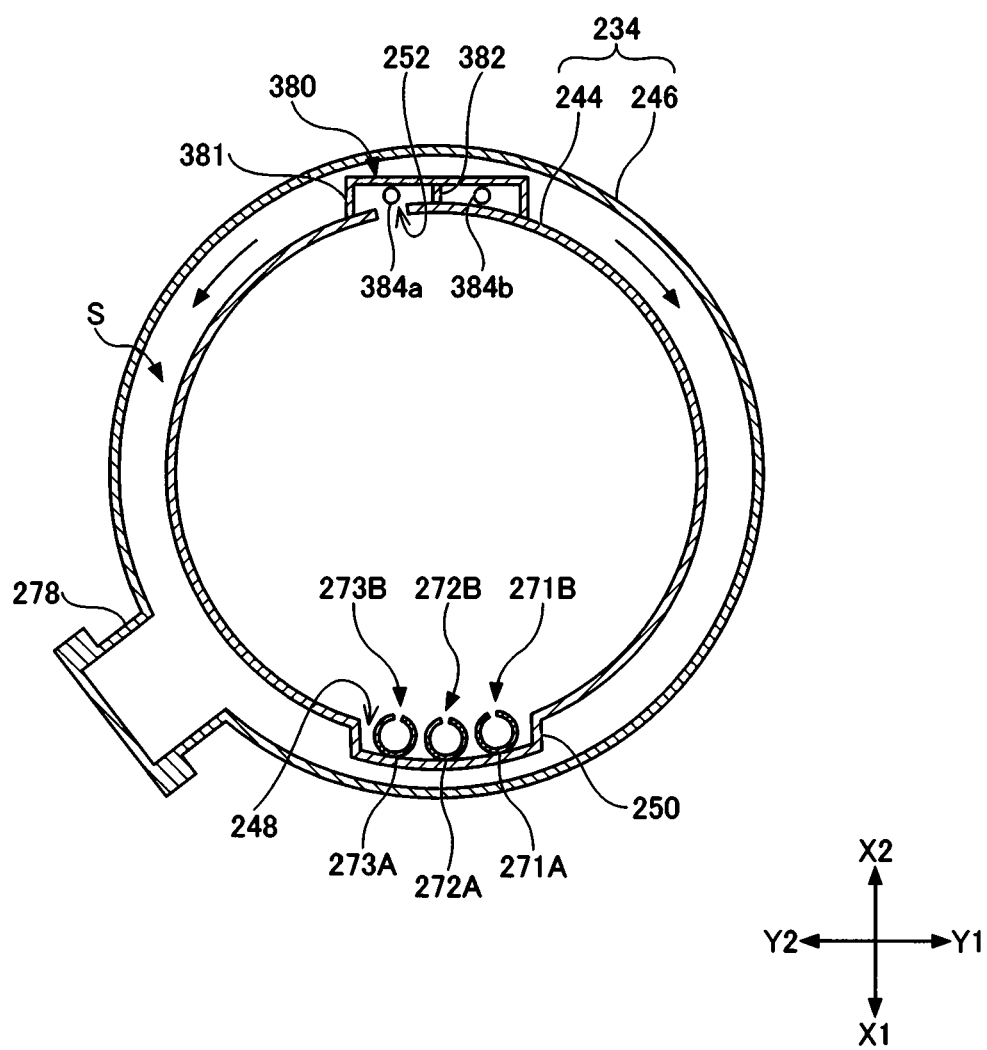
FIG. 9 is a horizontal cross-sectional view illustrating an example of the processing apparatus of third first embodiment.
Figure 10:
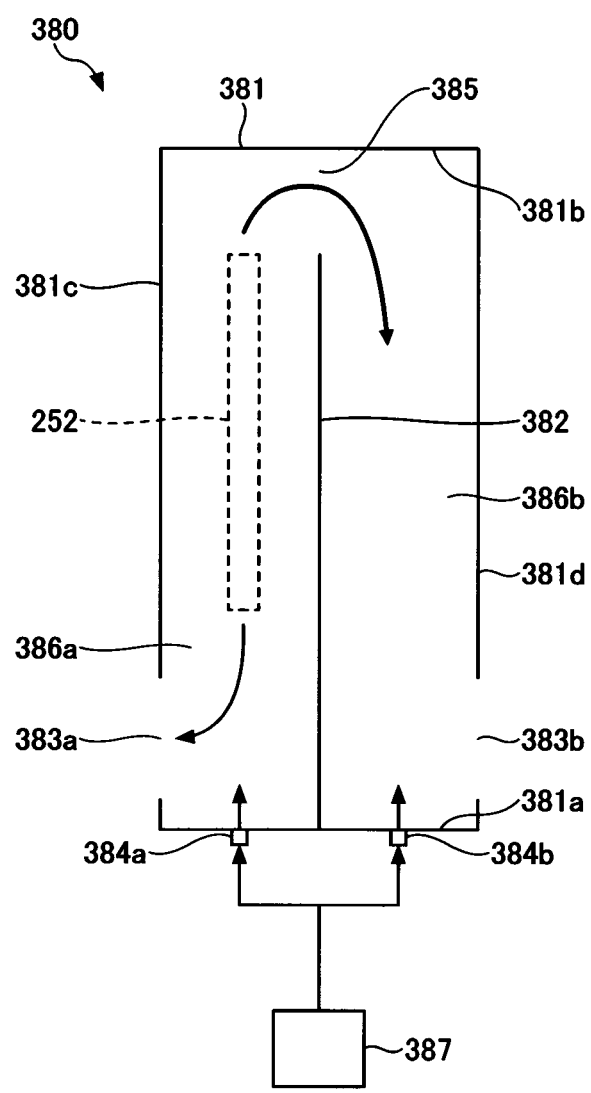
FIG. 10 is a view illustrating an example of an exhaust duct of the processing apparatus of the third embodiment.

An example of a processing apparatus 300 of a third embodiment will be described with reference to FIGS. 8 to 10. The processing apparatus 300 of the third embodiment differs from the processing apparatus 200 of the second embodiment in that the inner tube 244 includes an exhaust duct 380 provided to surround the exhaust window 252. Hereinafter, the differences from the processing apparatus 200 of the second embodiment will be mainly described.

The exhaust duct 380 is provided to surround the exhaust window 252. The exhaust duct 380 includes a wall portion 381, a flow-dividing plate 382, exhaust ports 383a and 383b, and gas introduction ports 384a and 384b.

The wall portion 381 is installed on the outer wall of the inner tube 244 to surround the exhaust window 252. The wall portion 381 is formed to protrude radially outward from the inner tube 244.

The flow-dividing plate 382 is provided inside the wall portion 381. The flow-dividing plate 382 has a rectangular shape and is provided parallel to the longitudinal direction of the exhaust window 252. The flow-dividing plate 382 connects the outer wall of the inner tube 244 and the inner wall of the wall portion 381 to each other. The flow-dividing plate 382 extends upward from the bottom portion 381a of the wall portion 381 and forms a gap 385 with a ceiling portion 381b of the wall portion 381. As a result, a portion of a processing gas flowing from the exhaust window 252 into the wall portion 381 passes through the exhaust flow path 386a, which leads to the exhaust port 383a from below the exhaust window 252, and the rest of the processing gas passes through the gap 385, which leads to the exhaust port 383b from above the exhaust window 252, and is exhausted through the exhaust flow path 386b, which leads to the exhaust port 383b.

The exhaust port 383a is provided below the exhaust window 252 in the wall portion 381. The exhaust port 383a exhausts, from below the exhaust window 252, the processing gas that flows from the exhaust window 252 into the wall portion 381.

The exhaust port 383b is provided at a position of the wall portion 381 at which the flow-dividing plate 382 is sandwiched. The exhaust port 383b exhausts, from above the exhaust window 252, the processing gas that flows from the exhaust window 252 into the wall portion 381.

The gas introduction port 384a is provided in the bottom portion 381a of the wall portion 381 on the side where the exhaust window 252 is provided. However, the gas introduction port 384a may be provided below the exhaust window 252 in the side portion 381c of the wall portion 381 on the side where the exhaust window 252 is provided. A ballast gas, the flow rate of which is controlled, is supplied from the ballast gas supplier 387 to the gas introduction port 384a. The gas introduction port 384a introduces the ballast gas supplied from the ballast gas supplier 387 into the exhaust flow path 386a.

The gas introduction port 384b is provided in the bottom portion 381a of the wall portion 381 on the side where the exhaust window 252 is not provided. However, the gas introduction port 384b may be provided in the side portion 381d of the wall portion 381 on the side where the exhaust window 252 is not provided. In addition, the gas introduction port 384b may be provided above the exhaust window 252 in the side portion 381c of the wall portion 381 on the side where the exhaust window 252 is provided. Furthermore, the gas introduction port 384b may be provided in the ceiling portion 381b of the wall portion 381. A ballast gas, the flow rate of which is controlled, is supplied from the ballast gas supplier 387 to the gas introduction port 384b. The gas introduction port 384b introduces the ballast gas supplied from the ballast gas supplier 387 into the exhaust flow path 386b.

The gas introduction ports 384a and 384b may be openings formed in the wall portion 381 or may be gas pipes that penetrate the wall portion 381 and extend to the interior of the wall portion 381. The ballast gas is, for example, an inert gas such as $N_2$ or Ar.

In the exhaust duct 380, the processing gas supplied into the inner tube 244 passes through the exhaust window 252 and flows into the wall portion 381. The processing gas that has flowed into the wall portion 381 is exhausted through either the exhaust port 383a or the exhaust port 383b. At this time, by introducing the ballast gas into the wall portion 381 from the gas introduction ports 384a and 384b, it is possible to control the conductance of the exhaust flow path 386a and the conductance of the exhaust flow path 386b. This makes it possible to adjust the balance between a flow rate of the processing gas exhausted through the exhaust port 383a and a flow rate of the processing gas exhausted through the exhaust port 383b. That is, it is possible to adjust an upward exhaust strength and a downward exhaust strength of the processing gas flowing through the exhaust window 252 in the exhaust duct 380. As a result, it is possible to adjust a flow rate distribution of the processing gas in the vertical direction (the interplane direction) in the inner tube 244.

For example, by increasing the flow rate of the ballast gas introduced from the gas introduction port 384a to the exhaust flow path 386a, the flow rate of the processing gas exhausted through the exhaust port 383a is decreased, and the flow rate of the processing gas exhausted through the exhaust port 383b is increased. In addition, by decreasing the flow rate of the ballast gas introduced from the gas introduction port 384a to the exhaust flow path 386a, the flow rate of the processing gas exhausted through the exhaust port 383a is increased, and the flow rate of the processing gas exhausted through the exhaust port 383b is decreased.

Further, for example, by increasing the flow rate of the ballast gas introduced from the gas introduction port 384b to the exhaust flow path 386b, the flow rate of the processing gas exhausted through the exhaust port 383a is increased, and the flow rate of the processing gas exhausted through the exhaust port 383b is decreased. In addition, by decreasing the flow rate of the ballast gas introduced from the gas introduction port 384b to the exhaust flow path 386b, the flow rate of the processing gas exhausted through the exhaust port 383a is decreased, and the flow rate of the processing gas exhausted from the exhaust port 383b is increased.

The exhaust ports 383a and 383b communicate with the space S. As a result, the processing gas that has passed through the exhaust ports 383a and 383b is exhausted by the exhauster 241 via the space S. The exhauster 241 is provided with a pressure control valve 279a, an exhaust passage 279b, and a vacuum pump 279c in this order from the exhaust pipe 278, so that the interior of the processing container 234 can be evacuated in this order.

Fourth Embodiment

Figure 11:
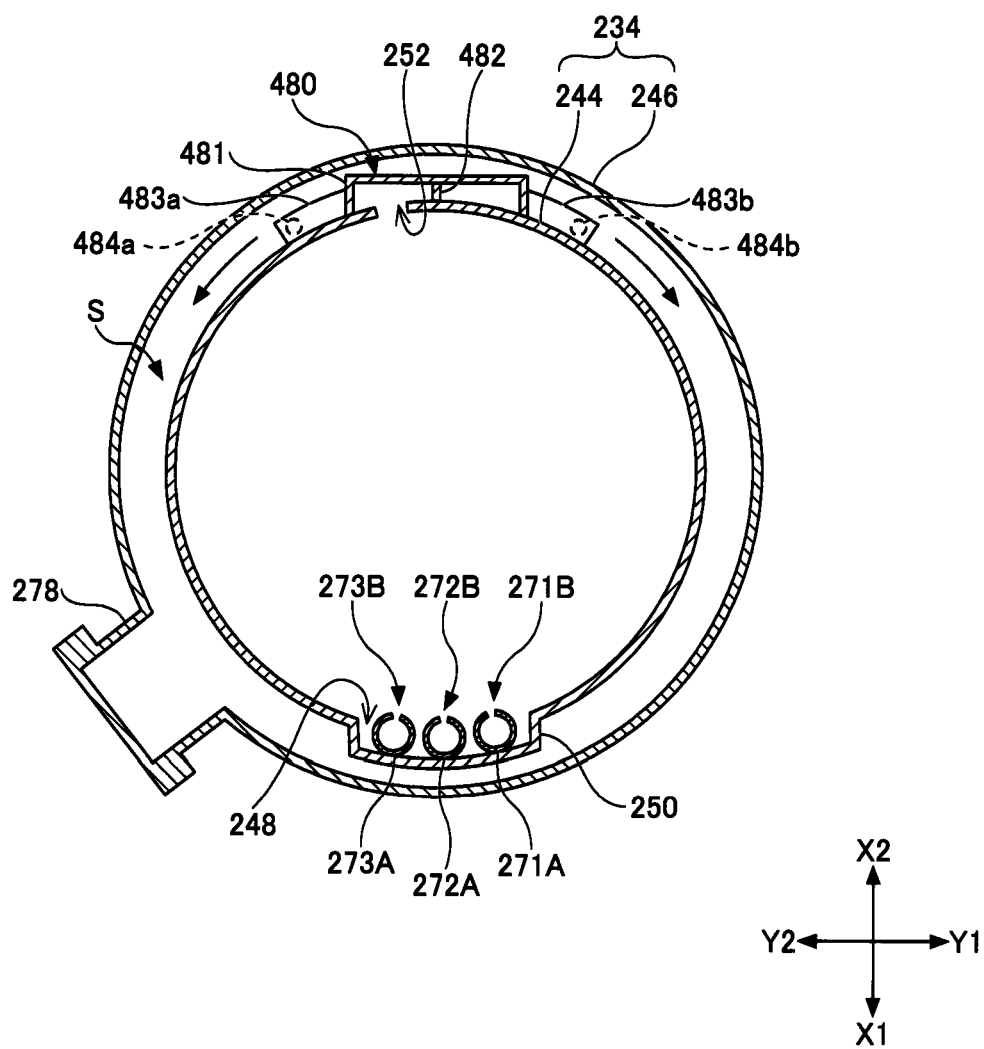
FIG. 11 is a horizontal cross-sectional view illustrating an example of the processing apparatus of a fourth embodiment.

An example of a processing apparatus 400 of a fourth embodiment will be described with reference to FIGS. 11 and 12. The processing apparatus 400 of the fourth embodiment differs from the processing apparatus 300 of the third embodiment in that the exhaust port provided in the lower portion of the exhaust duct extends in the circumferential direction of the processing container. Hereinafter, the differences from the processing apparatus 300 of the third embodiment will be mainly described.

The exhaust duct 480 is provided to surround the exhaust window 252. The exhaust duct 480 includes a wall portion 481, a flow-dividing plate 482, exhaust ports 483a and 483b, and gas introduction ports 484a and 484b.

The wall portion 481 is installed on the outer wall of the inner tube 244 to surround the exhaust window 252. The wall portion 481 is formed to protrude outward in the radial direction from the inner tube 244.

The flow-dividing plate 482 is provided inside the wall portion 481. The flow-dividing plate 482 has a rectangular shape and is provided parallel to the longitudinal direction of the exhaust window 252. The flow-dividing plate 482 connects the outer wall of the inner tube 244 and the inner wall of the wall portion 481 to each other. The flow-dividing plate 482 extends upward from the bottom portion 481a of the wall portion 481 and forms a gap 485 with a ceiling portion 481b of the wall portion 481. As a result, a portion of a processing gas flowing from the exhaust window 252 into the wall portion 481 passes through the exhaust flow path 486a, which leads to the exhaust port 483a from below the exhaust window 252, and the rest of the processing gas passes through the gap 485, which leads to the exhaust port 483a from above the exhaust window 252, and is exhausted through the exhaust flow path 486b leading to the exhaust port 483b.

The exhaust port 483a is provided below the exhaust window 252 in the wall portion 481. The exhaust port 483a extends in the circumferential direction in the lower portion of the wall portion 481. The exhaust port 483a exhausts, from below the exhaust window 252, the processing gas that flows from the exhaust window 252 into the wall portion 481.

The exhaust port 483b is provided at a position of the wall portion 481 at which the flow-dividing plate 482 is sandwiched. The exhaust port 483b extends in the circumferential direction in the lower portion of the wall portion 481. The exhaust port 483b exhausts, from above the exhaust window 252, the processing gas that flows from the exhaust window 252 into the wall portion 481.

The gas introduction port 484a is provided in a portion of the exhaust port 483a extending in the circumferential direction. As a result, it is possible to prevent the ballast gas introduced from the gas introduction port 484a into the exhaust flow path 486a from passing through the exhaust window 252 and backwardly spreading into the inner tube 244. However, the gas introduction port 484a may be provided in the bottom portion 481a of the wall portion 481 on the side where the exhaust window 252 is provided. In addition, the gas introduction port 484a may be provided below the exhaust window 252 in the side portion 481c of the wall portion 481 on the side where the exhaust window 252 is provided. A ballast gas, the flow rate of which is controlled, is supplied from the ballast gas supplier 487 to the gas introduction port 484a. The gas introduction port 484a introduces the ballast gas supplied from the ballast gas supplier 487 into the exhaust flow path 486a.

The gas introduction port 484b is provided in a portion of the exhaust port 483b extending in the circumferential direction. As a result, it is possible to prevent the ballast gas introduced from the gas introduction port 484b into the exhaust flow path 486b from passing through the exhaust window 252 and backwardly spreading into the inner tube 244. However, the gas introduction port 484b may be provided in the bottom portion 481a of the wall portion 481 on the side where the exhaust window 252 is not provided. In addition, the gas introduction port 484b may be provided in the side portion 481d of the wall portion 481 on the side where the exhaust window 252 is not provided. In addition, the gas introduction port 484b may be provided above the exhaust window 252 in the side portion 481c of the wall portion 481 on the side where the exhaust window 252 is provided. Furthermore, the gas introduction port 484b may be provided in the ceiling portion 481b of the wall portion 481. A ballast gas, the flow rate of which is controlled, is supplied from the ballast gas supplier 487 to the gas introduction port 484b. The gas introduction port 484b introduces the ballast gas supplied from the ballast gas supplier 487 into the exhaust flow path 486b.

The gas introduction ports 484a and 484b may be openings formed in the wall portion 481 or may be gas pipes that penetrate the wall portion 481 and extend to the interior of the wall portion 481. The ballast gas is, for example, an inert gas such as $N_2$ or Ar.

In the exhaust duct 480, the processing gas supplied into the inner tube 244 passes through the exhaust window 252 and flows into the wall portion 481. The processing gas that has flowed into the wall portion 481 is exhausted through either the exhaust port 483a or the exhaust port 483b. At this time, by introducing the ballast gas into the wall portion 481 from the gas introduction ports 484a and 484b, it is possible to control the conductance of the exhaust flow path 486a and the conductance of the exhaust flow path 486b. This makes it possible to adjust the balance between a flow rate of the processing gas exhausted through the exhaust port 483a and a flow rate of the processing gas exhausted through the exhaust port 483b. That is, it is possible to adjust an upward exhaust strength and a downward exhaust strength of the processing gas flowing through the exhaust window 252 in the exhaust duct 480. As a result, it is possible to adjust a flow rate distribution of the processing gas in the vertical direction (the interplane direction) in the inner tube 244.

For example, by increasing the flow rate of the ballast gas introduced from the gas introduction port 484a to the exhaust flow path 486a, the flow rate of the processing gas exhausted through the exhaust port 483a is decreased, and the flow rate of the processing gas exhausted through the exhaust port 483b is increased. In addition, by decreasing the flow rate of the ballast gas introduced from the gas introduction port 484a to the exhaust flow path 486a, the flow rate of the processing gas exhausted through the exhaust port 483a is increased, and the flow rate of the processing gas exhausted through the exhaust port 483b is decreased.

For example, by increasing the flow rate of the ballast gas introduced from the gas introduction port 484b to the exhaust flow path 486b, the flow rate of the processing gas exhausted through the exhaust port 483a is increased, and the flow rate of the processing gas exhausted through the exhaust port 483b is decreased. In addition, by decreasing the flow rate of the ballast gas introduced from the gas introduction port 484b to the exhaust flow path 486b, the flow rate of the processing gas exhausted through the exhaust port 483a is decreased, and the flow rate of the processing gas exhausted from the exhaust port 483b is increased.

[Analysis Results]

First, with reference to FIGS. 13A and 13B and FIG. 14, the results of analysis by computational fluid dynamics (CFD) (hereinafter referred to as "CFD analysis") when a processing container having a single-tube structure was used will be described.

Figure 13A:
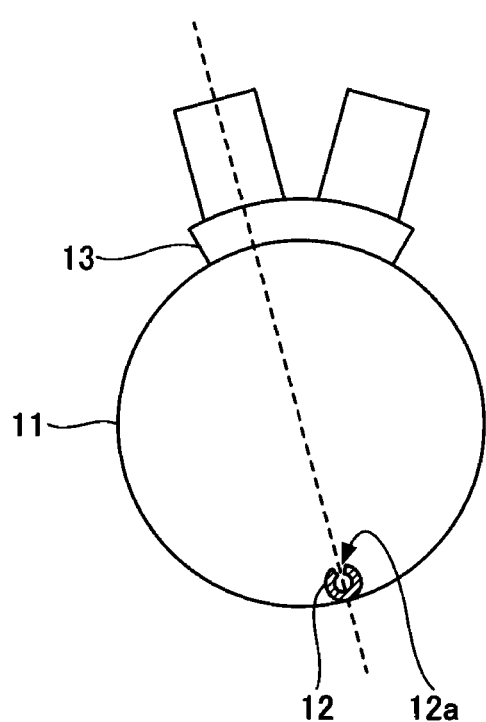
FIGS. 13A and 13B are schematic views illustrating a model of a processing apparatus used in an analysis.
Figure 13B:
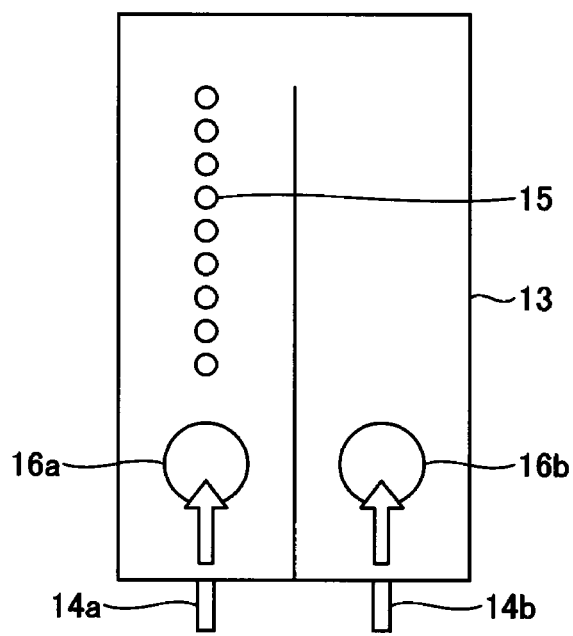

FIGS. 13A and 13B are schematic views illustrating a model of a processing apparatus used in the analysis. FIG. 13A is a view of the processing container viewed from the above, and FIG. 13B is a view of the exhaust duct viewed from the center of the processing container.

In this analysis, the analysis was performed using a model of an apparatus corresponding to the processing apparatus 100 of the first embodiment, that is, an apparatus including a processing container having a single-tube structure as illustrated in FIG. 13A. In this analysis, an interplane distribution of mass flow rates of the processing gas was analyzed when the flow rate of the ballast gas introduced from the gas introduction ports 14a and 14b provided in the lower portion of the exhaust duct 13 was changed in the state in which the processing gas was supplied from the plurality of gas holes 12a of an injector 12 inside the processing container 11. In this analysis, it was assumed that the exhaust window was formed by a plurality of exhaust holes 15, and the gas introduction ports 14a and 14b were provided to correspond to the exhaust ports 16a and 16b provided in the lower portion of the exhaust duct 13. In addition, the number of gas holes 12a was 61 (diameter: 0.5 mm), the number of exhaust holes 15 was 61 (diameter: 8.0 mm), the processing gas was $N_2$, and the ballast gas was $N_2$.

Figure 14:
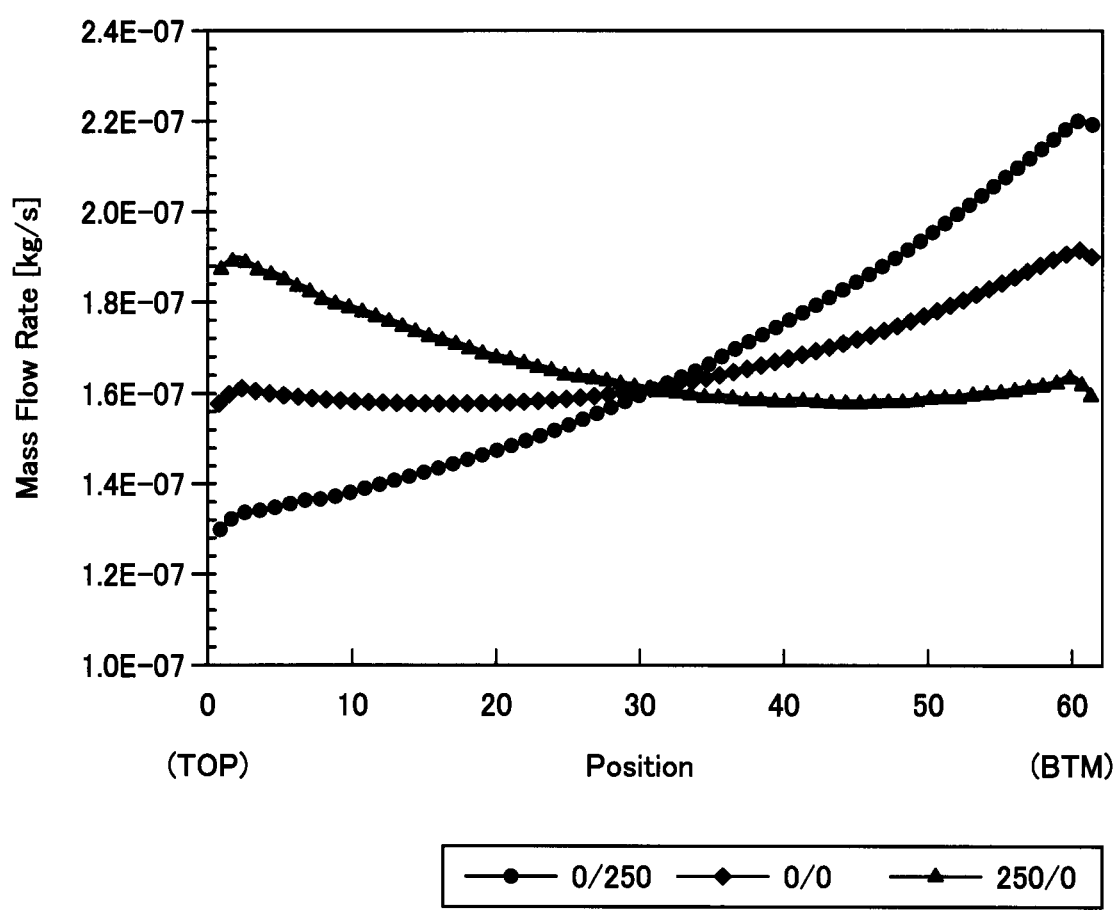
FIG. 14 is a view showing analysis results of an interplane distribution of mass flow rates of a processing gas passing through exhaust holes.

FIG. 14 is a view showing the analysis results of an interplane distribution of mass flow rates of a processing gas passing through exhaust holes 15. In FIG. 14, the horizontal axis represents the slot numbers (Slot #) of the exhaust holes 15, and the vertical axis represents the mass flow rate [kg/s] of the processing gas. The slot numbers are the numbers for identifying the exhaust holes 15, and the smaller the slot number is, the closer the exhaust hole 15 is located to the top (TOP) side, and the larger the slot number is, the closer the exhaust hole 15 is located to the bottom (BTM) side. In FIG. 14, circle marks indicate the results when the amount of the ballast gas introduced from the gas introduction port 14a was set to 0 sccm, and the amount of the ballast gas introduced from the gas introduction port 14b was set to 250 sccm. The diamond marks indicate the results when the amount of the ballast gas introduced from the gas introduction port 14a was set to 0 sccm, and the amount of the ballast gas introduced from the gas introduction port 14b was set to 0 sccm. The triangle marks indicate the results when the amount of the ballast gas introduced from the gas introduction port 14a was set to 250 sccm, and the amount of the ballast gas introduced from the gas introduction port 14b was set to 0 sccm.

As shown in FIG. 14, it can be seen that the distribution of the mass flow rates of the processing gas passing through the exhaust holes 15 is changed by changing the amount of the ballast gas introduced from the gas introduction ports 14a and 14b. Specifically, by setting the amount of the ballast gas introduced from the gas introduction port 14a to 0 sccm and setting the amount of the ballast gas introduced from the gas introduction port 14b to 250 sccm, it can be seen that the mass flow rate of the processing gas exhibits a very large downward exhaust tendency (a strong downward exhaust tendency) on the BTM side rather than on the TOP side. In addition, by setting the amount of the ballast gas introduced from the gas introduction port 14a to 0 sccm and setting the amount of the ballast gas introduced from the gas introduction port 14b to 0 sccm, it can be seen that the mass flow rate of the processing gas exhibits a slightly large downward exhaust tendency (a weak downward exhaust tendency) on the BTM side rather than on the TOP side. In addition, by setting the amount of the ballast gas introduced from the gas introduction port 14a to 250 sccm and setting the amount of the ballast gas introduced from the gas introduction port 14b to 0 sccm, it can be seen that the mass flow rate of the processing gas exhibits a large upward exhaust tendency on the TOP side rather than on the BTM side. From the above results, it was shown that by changing the amount of the ballast gas introduced from the gas introduction ports 14a and 14b, the downward exhaust tendency and the upward exhaust tendency can be selectively realized.

Next, with reference to FIGS. 15A and 15B and FIG. 16, the results of CFD analysis when a processing container having a double-tube structure was used will be described.

Figure 15A:
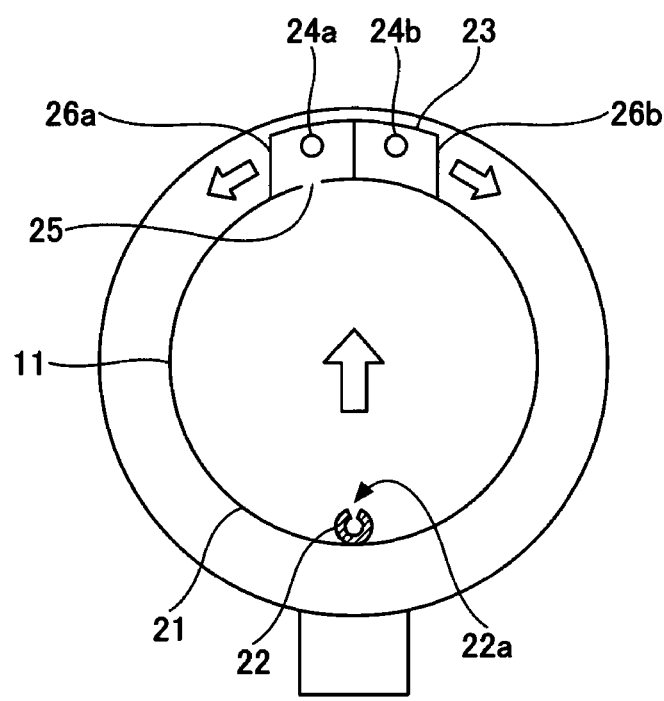
FIGS. 15A and 15B are schematic views illustrating a model of a processing apparatus used in an analysis.
Figure 15B:
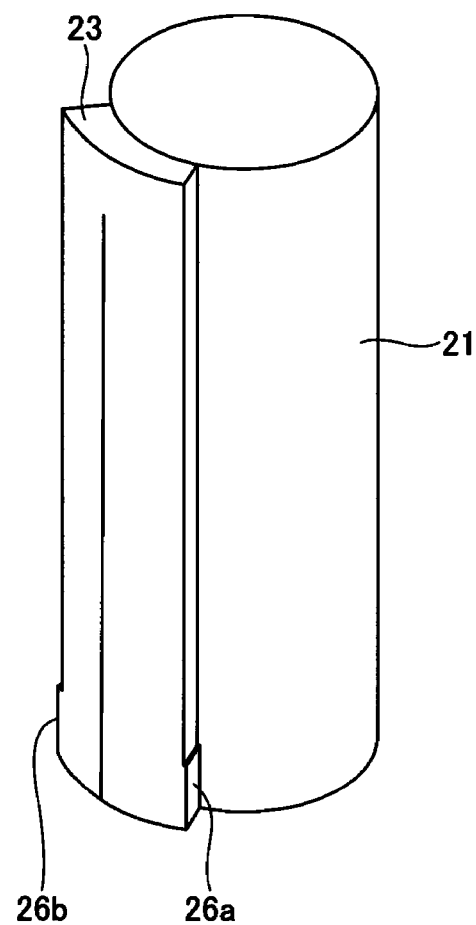

FIGS. 15A and 15B are schematic views illustrating a model of the processing apparatus used in the analysis. FIG. 15A is a cross-sectional view of the processing apparatus including a processing container and an exhaust duct, and FIG. 15B is a perspective view of the processing apparatus including the processing container and the exhaust duct.

In this analysis, the analysis was performed using a model of an apparatus corresponding to the processing apparatus 300 of the third embodiment, that is, an apparatus including a processing container having a double-tube structure as illustrated in FIG. 15A. In this analysis, an interplane distribution of mass flow rates of the processing gas was analyzed when the flow rate of the ballast gas introduced from the gas introduction ports 24a and 24b provided in the lower portion of the exhaust duct 23 was changed in the state in which the processing gas was supplied from the plurality of gas holes 22a of the diffusion injector 22 in the inner tube 21. In this analysis, it was assumed that the exhaust window was formed by a plurality of exhaust holes 25, and the gas introduction ports 24a and 24b were provided to correspond to the exhaust ports 26a and 26b provided in the lower portion of the exhaust duct 23. In addition, the number of gas holes 22a was 61 (diameter: 0.5 mm), the number of exhaust holes 25 was 61 (diameter: 8.0 mm), the processing gas was $N_2$, and the ballast gas was $N_2$.

Figure 16:
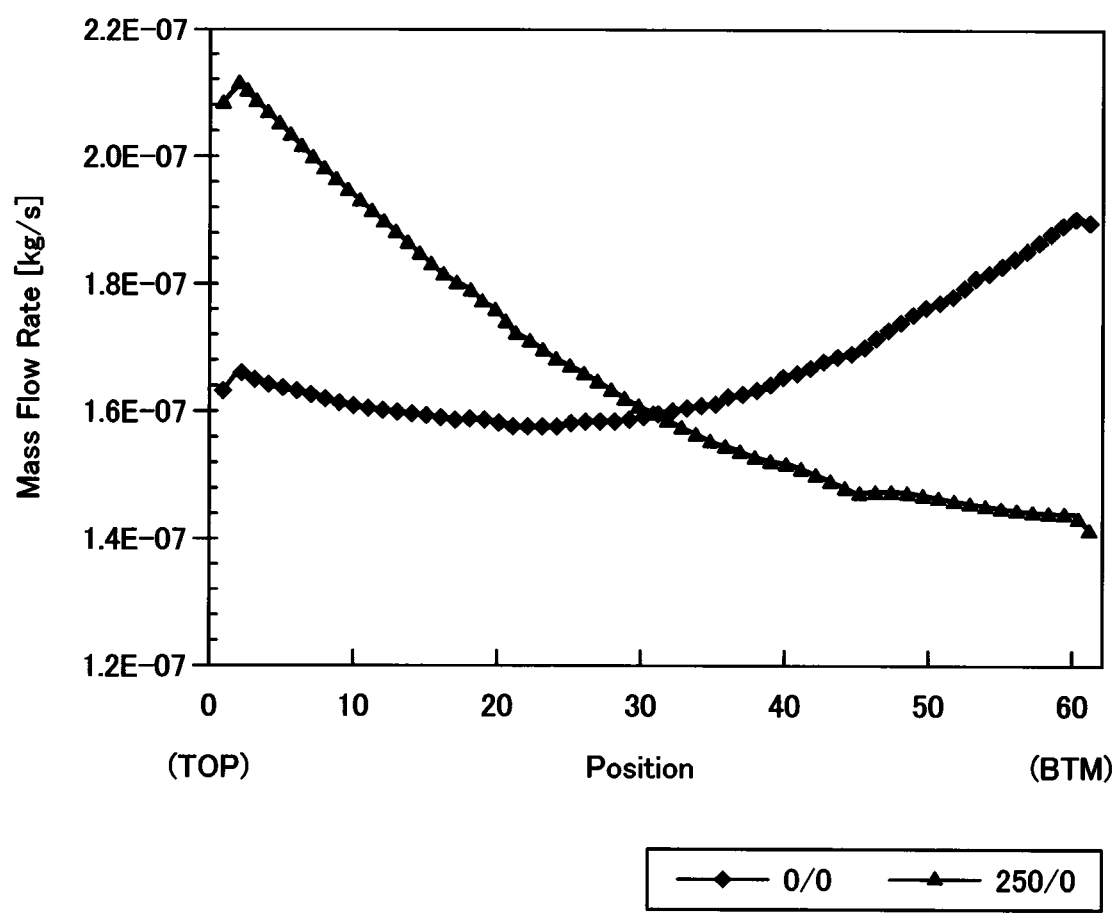
FIG. 16 is a view showing analysis results of an interplane distribution of mass flow rates of a processing gas passing through exhaust holes.

FIG. 16 is a view showing the analysis results of an interplane distribution of mass flow rates of a processing gas passing through exhaust holes 25. In FIG. 16, the horizontal axis represents the slot numbers (Slot #) of the exhaust holes 25, and the vertical axis represents the mass flow rate [kg/s] of the processing gas. The slot numbers are the numbers for identifying the exhaust holes 25, and a smaller slot number indicates an exhaust hole 25 located closer to the top (TOP) side, and a larger slot number indicates an exhaust hole 15 located closer to the bottom (BTM) side. In FIG. 16, diamond marks indicate the results when the amount of the ballast gas introduced from the gas introduction port 24a was set to 0 sccm, and the amount of the ballast gas introduced from the gas introduction port 24b was set to 0 sccm. The triangle marks indicate the results when the amount of the ballast gas introduced from the gas introduction port 24a was set to 250 sccm, and the amount of the ballast gas introduced from the gas introduction port 24b was set to 0 sccm.

As shown in FIG. 16, it can be seen that the distribution of the mass flow rates of the processing gas passing through the exhaust holes 25 is changed by changing the amount of the ballast gas introduced from the gas introduction ports 24a and 24b. Specifically, by setting the amount of the ballast gas introduced from the gas introduction port 24a to 0 sccm and setting the amount of the ballast gas introduced from the gas introduction port 24b to 0 sccm, it can be seen that the mass flow rate of the processing gas exhibits a large downward exhaust tendency on the BTM side rather than on the TOP side. In addition, by setting the amount of the ballast gas introduced from the gas introduction port 24a to 250 sccm and setting the amount of the ballast gas introduced from the gas introduction port 24b to 0 sccm, it can be seen that the mass flow rate of the processing gas exhibits a large upward exhaust tendency on the TOP side rather than on the BTM side. From the above results, it was shown that by changing the amount of the ballast gas introduced from the gas introduction ports 24a and 24b, the downward exhaust tendency and the upward exhaust tendency can be selectively realized.

In the above embodiment, the gas introduction ports 184a, 284a, 384a, and 484a are examples of first gas introduction parts, and the gas introduction ports 184b, 284b, 384b, and 484b are examples of second gas introduction parts. In addition, the exhaust flow paths 186a, 286a, 386a, and 486a are examples of first exhaust flow paths, and the exhaust flow paths 186b, 286b, 386b, and 486b are examples of second exhaust flow paths.

According to the present disclosure, it is possible to adjust a flow of a gas in an interplane direction.

It should be understood that the embodiments disclosed herein are exemplary in all respects and are not restrictive. The above-described embodiments may be omitted, replaced, or modified in various forms without departing from the scope and spirit of the appended claims.

What is claimed is:

1. A processing apparatus comprising:
a processing container having a substantially cylindrical shape;
a gas supply pipe configured to supply a gas into the processing container; and
an exhaust duct extending in a longitudinal direction of the processing container to form an exhaust window configured to exhaust the gas from an interior of the processing container, a first exhaust flow path configured to exhaust, from a first side in a longitudinal direction of the exhaust window, the gas exhausted through the exhaust window, and a second exhaust flow path configured to exhaust, from a second side in the longitudinal direction of the exhaust window, the gas exhausted through the exhaust window,
wherein the exhaust duct includes:
a first gas introduction part configured to introduce a ballast gas into the first exhaust flow path, and
a second gas introduction part configured to introduce the ballast gas into the second exhaust flow path.

2. The processing apparatus of claim 1, wherein the exhaust window includes a rectangular exhaust slit extending along the longitudinal direction of the processing container.

3. The processing apparatus of claim 2, wherein the processing container has a single-tube structure and the exhaust window is formed on an outer wall of the processing container, and
wherein the exhaust duct further includes:
a wall portion installed on the outer wall of the processing container to surround the exhaust window; and
a flow-dividing plate provided inside the wall portion to divide the gas exhausted from the exhaust window into the first exhaust flow path and the second exhaust flow path.

4. The processing apparatus of claim 3, wherein the flow-dividing plate is provided in parallel with the longitudinal direction of the exhaust window.

5. The processing apparatus of claim 4, wherein the flow-dividing plate extends upward from a bottom of the wall portion to form a gap with a ceiling portion of the wall portion.

6. The processing apparatus of claim 1, wherein the exhaust window includes a plurality of exhaust holes provided at intervals along the longitudinal direction of the processing container.

7. The processing apparatus of claim 6, wherein the processing container has a single-tube structure and the exhaust window is formed on an outer wall of the processing container, and
wherein the exhaust duct further includes:
a wall portion installed on the outer wall of the processing container to surround the exhaust window; and
a flow-dividing plate provided inside the wall portion to divide the gas exhausted from the exhaust window into the first exhaust flow path and the second exhaust flow path.

8. The processing apparatus of claim 7, wherein the flow-dividing plate is provided in parallel with the longitudinal direction of the exhaust window.

9. The processing apparatus of claim 8, wherein the flow-dividing plate extends upward from a bottom of the wall portion to form a gap with a ceiling portion of the wall portion.

10. The processing apparatus of claim 1, wherein the processing container has a single-tube structure and the exhaust window is formed on an outer wall of the processing container, and
wherein the exhaust duct further includes:
a wall portion installed on the outer wall of the processing container to surround the exhaust window; and
a flow-dividing plate provided inside the wall portion to divide the gas exhausted from the exhaust window into the first exhaust flow path and the second exhaust flow path.

11. The processing apparatus of claim 1, wherein the processing container has a double-tube structure including an inner tube and an outer tube, the exhaust window is formed on an outer wall of the inner tube, and an exhaust pipe configured to exhaust the gas between the inner tube and the outer tube is connected to the outer tube, and
wherein the exhaust duct includes a flow-dividing plate configured to divide the gas exhausted from the exhaust window into the first exhaust flow path and the second exhaust flow path.

12. The processing apparatus of claim 11, wherein the flow-dividing plate is provided in parallel with the longitudinal direction of the exhaust window.

13. The processing apparatus of claim 12, wherein the flow-dividing plate forms, on a first side of a space between the inner tube and the outer tube, which leads to the exhaust pipe from the exhaust window, a gap in an upper portion of the space, and forms, on a second side of the space, a gap in a lower portion of the space.

14. The processing apparatus of claim 1, wherein the processing container has a double-tube structure including an inner tube and an outer tube, and the exhaust window is formed on an outer wall of the inner tube, and
wherein the exhaust duct further includes:
a wall portion installed on the outer wall of the inner tube to surround the exhaust window, and
a flow-dividing plate provided inside the wall portion to divide the gas exhausted from the exhaust window into the first exhaust flow path and the second exhaust flow path.

15. The processing apparatus of claim 14, wherein the flow-dividing plate is provided in parallel with the longitudinal direction of the exhaust window.

16. The processing apparatus of claim 15, wherein the flow-dividing plate extends upward from a bottom portion of the wall portion to form a gap with a ceiling portion of the wall portion.

17. The processing apparatus of claim 16, wherein the wall portion is formed such that the first exhaust flow path and the second exhaust flow path extend in a circumferential direction of the processing container in a lower portion of the wall portion,
the first gas introduction part is configured to introduce the ballast gas into an extending portion of the first exhaust flow path, and
the second gas introduction part is configured to introduce the ballast gas into an extending portion of the second exhaust flow path.

* * * * *